United States Patent [19]
Lebhar

[11] Patent Number: 5,978,881
[45] Date of Patent: Nov. 2, 1999

[54] SCALABLE SWITCHER WITH DETACHABLY SECURABLE FRAME ADAPTER CARDS FOR ROUTING AUDIO AND VIDEO SIGNALS

[75] Inventor: Martial L. Lebhar, Chino Valley, Ariz.

[73] Assignee: Sigma Electronics, Inc., Petersburg, Pa.

[21] Appl. No.: 08/803,784

[22] Filed: Feb. 24, 1997

[51] Int. Cl.$^6$ .................................................. G06F 13/00
[52] U.S. Cl. .......................... 710/131; 710/100; 710/103; 709/231
[58] Field of Search ............................... 395/311, 200.61; 358/335

[56] References Cited

U.S. PATENT DOCUMENTS

| | | | |
|---|---|---|---|
| 4,901,312 | 2/1990 | Hui et al. | 370/85.12 |
| 5,144,548 | 9/1992 | Salandro | 364/138 |
| 5,249,178 | 9/1993 | Kurano et al. | 370/60 |
| 5,390,336 | 2/1995 | Hillis | 395/800 |
| 5,404,461 | 4/1995 | Olnowich et al. | 710/131 |
| 5,434,977 | 7/1995 | Zapisek | 710/131 |
| 5,530,814 | 6/1996 | Wong et al. | 710/131 |
| 5,532,830 | 7/1996 | Schuler | 358/335 |
| 5,603,086 | 2/1997 | Cree et al. | 455/34.1 |
| 5,625,780 | 4/1997 | Hsieh et al. | 395/311 |
| 5,668,948 | 9/1997 | Belknap et al. | 395/200.61 |
| 5,764,896 | 6/1998 | Johnson | 395/200.8 |
| 5,790,539 | 8/1998 | Chao et al. | 370/390 |
| 5,802,278 | 9/1998 | Isfeld et al. | 710/131 |

*Primary Examiner*—Ayaz R. Sheikh
*Assistant Examiner*—Eric S. Thlang
*Attorney, Agent, or Firm*—Reed Smith Shaw & McClay

[57] ABSTRACT

A switcher for selectively routing a plurality of input signals to a plurality of output signal ports. The switcher includes a motherboard disposed in a housing, and a switch card for routing ones of the input signals to an output card, wherein the output card functions to amplify signals received from the switch card. The output card and the switch card are also disposed in the housing, and are electronically coupled to each other and to the motherboard by a signal bus on the motherboard. A controller card is provided for controlling the routing of the input signals to the output signal ports. The controller card, the output card, and the switch card are electronically coupled to each other and to the motherboard by a control bus on the motherboard. A first input frame adapter card is provided for receiving the input signals and providing the input signals to the switch card and the motherboard, and a first output frame adapter card having the output signal ports is provided for receiving amplified signals from the output card and outputting the amplified signals from the switcher. The input frame adapter card and the output frame adapter card are detachably coupled to the housing and to the signal bus on the motherboard.

21 Claims, 6 Drawing Sheets

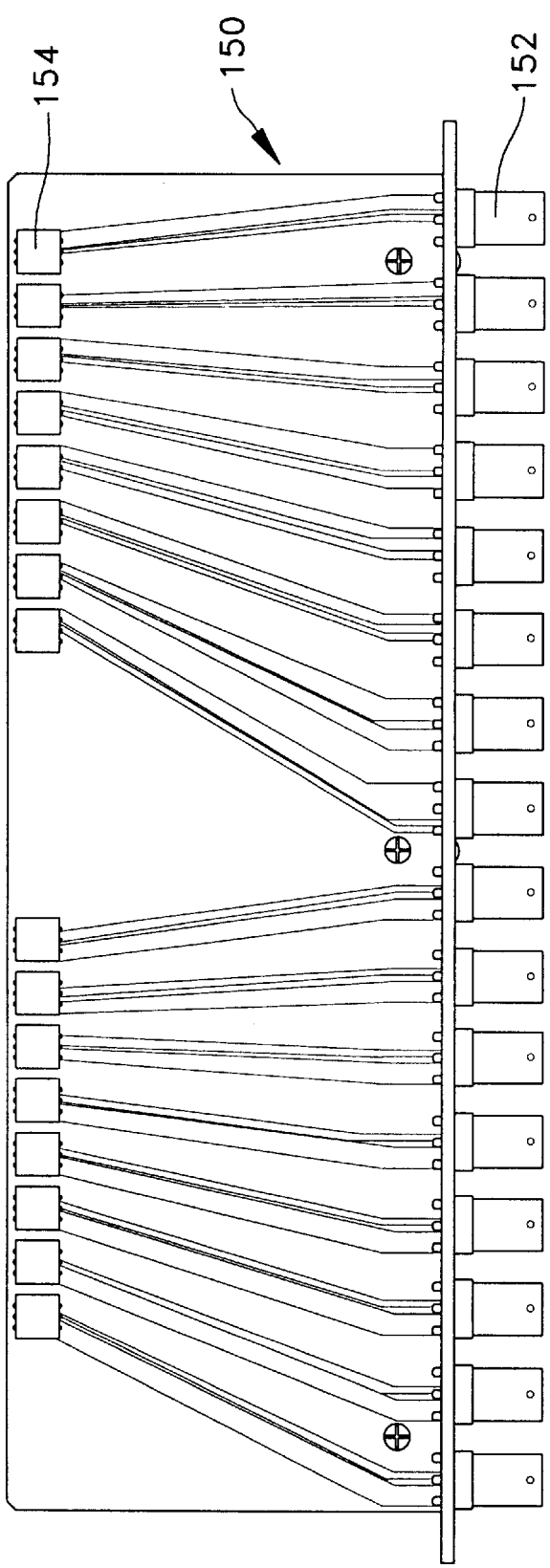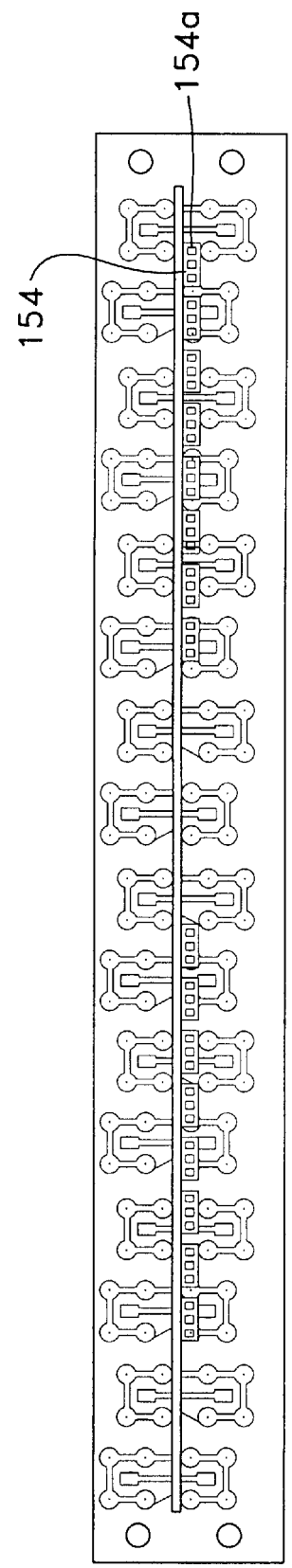
FIG. 6
FIG. 7

SCALABLE SWITCHER WITH DETACHABLY SECURABLE FRAME ADAPTER CARDS FOR ROUTING AUDIO AND VIDEO SIGNALS

FIELD OF THE INVENTION

The present invention relates generally to the field of signal processing. More particularly, the present invention relates to switchers for selectively routing large numbers of video and/or audio input signals to a plurality of output signal ports.

BACKGROUND OF THE INVENTION

Switchers are typically used in audio/video production and broadcasting studios for selectively routing large numbers of input signals to output port signals. Such switchers are typically disposed in a housing mounted in a computer rack, and are controlled by a general purpose computer or micro-processor. A typical switcher contains a motherboard disposed in the housing, and a plurality of switch cards for routing various input signals to one or more output cards. Each output card typically functions to amplify signals received from a switch card. Separate frame input and frame output cards are also typically hard wired to the motherboard. The frame input cards function to receive the various input signals into the switcher, and provide the input-signals to a switch card and the motherboard. Each frame output card has output signal ports for receiving amplified signals from an output card and outputting the amplified signals from the switcher.

One significant drawback of the aforementioned switchers is their lack of scalability. More particularly, since the frame input cards and the frame output cards are typically hard wired to the motherboard, it is cumbersome to upgrade or modify a switcher to include further frame input cards and further frame output cards after the switcher has been installed. As a result, a user of a switcher who lacks a present need for a switcher with many frame input and frame output cards, but who anticipates needing a switcher with further capabilities in the future, may be required to purchase and install a switcher with more capacity or capabilities than presently required, in order to avoid having to replace the unit at a later date in order to gain further capacity. In view of this problem, it would desirable to provide a scaleable switcher which could be installed with a minimum number of frame input and frame output cards, and which could be easily and economically upgraded or modified on-site to include further or alternative frame input and frame output cards when desired by the user.

It is therefore an object of the present invention to provide a switcher which can function with a minimum number of frame input and frame output cards, and which can be easily and economically upgraded on-site to include further frame input and frame output cards.

It is a further object of the present invention to provide a switcher which can be easily modified on-site to handle different types of input and output signals.

These and other objects and advantages of the invention will become more fully apparent from the description and claims which follow or may be learned by the practice of the invention.

SUMMARY OF THE INVENTION

The present invention is directed to a switcher for selectively routing a plurality of input signals to a plurality of output signal ports. The switcher includes a motherboard disposed in a housing, and a switch card for routing ones of the input signals to an output card, wherein the output card functions to amplify signals received from the switch card. The output card and the switch card are also disposed in the housing, and are electronically coupled to each other and to the motherboard by a signal bus on the motherboard. A controller card is provided for controlling the routing of the input signals to the output signal ports. The controller card, the output card, and the switch card are electronically coupled to each other and to the motherboard by a control bus on the motherboard. A first input frame adapter card is provided for receiving the input signals and providing the input signals to the switch card and the motherboard, and a first output frame adapter card having the output signal ports is provided for receiving amplified signals from the output card and outputting the amplified signals from the switcher. The input frame adapter card and the output frame adapter card are detachably coupled to the housing and to the signal bus on the motherboard.

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings.

FIG. 2 shows the front face of the motherboard disposed within the switcher.

FIG. 3 shows the rear face of the motherboard disposed within the switcher.

FIG. 6 is a side view of a frame adapter card for receiving or outputting video signals, in accordance with a preferred embodiment of the present invention.

FIG. 7 is an end view of the frame adapter card shown in FIG. 6.

DETAILED DESCRIPTION OF THE PREFERRED EMBODIMENTS

Figure 1:
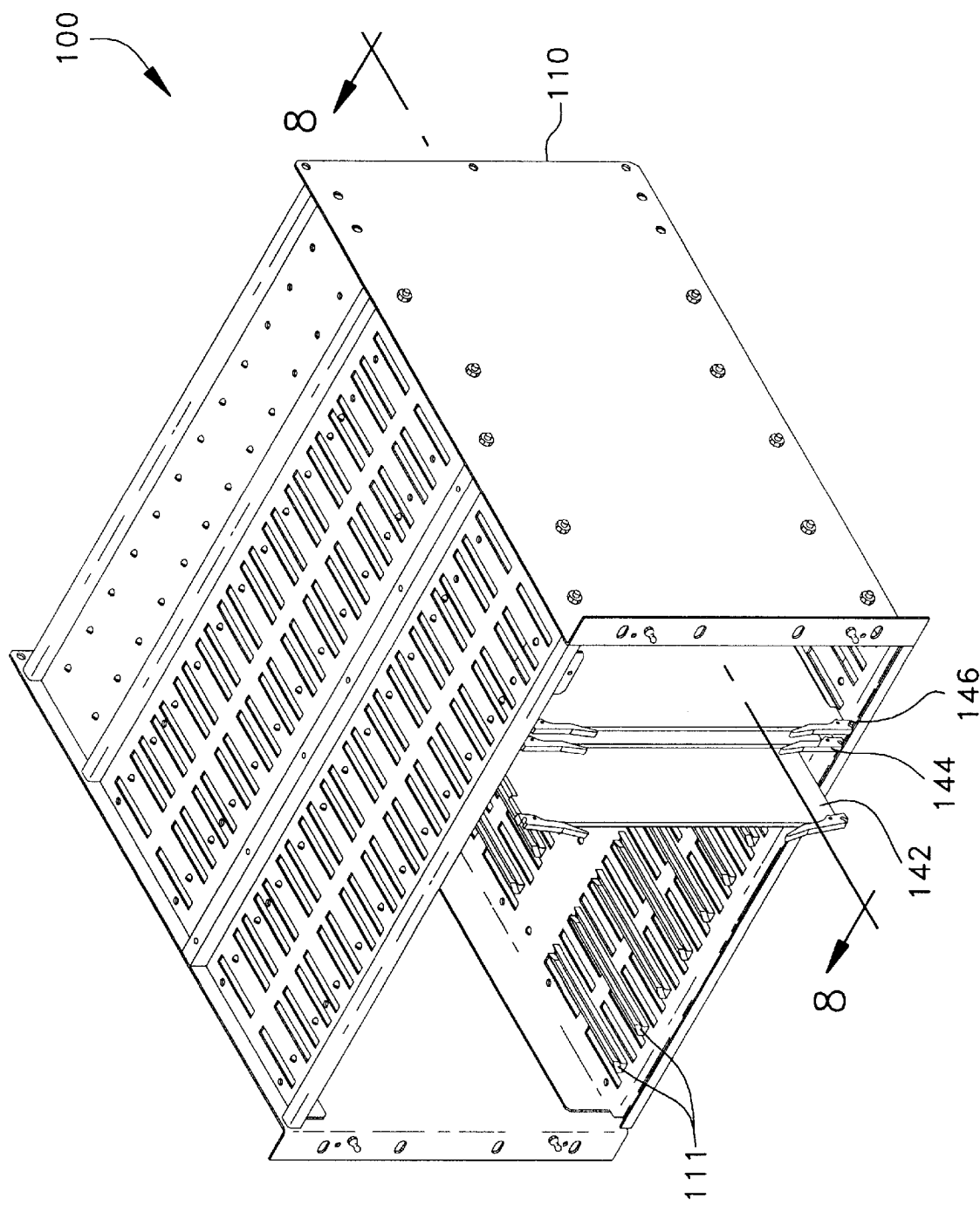
FIG. 1 is an isometric view of a switcher, in accordance with a preferred embodiment of the present invention.

Reference will now be made to the drawings wherein like structures are provided with like reference designations. It will be understood that the drawings included herewith only provide diagrammatic representations of the presently preferred structures of the present invention and that structures falling within the scope of the present invention may include structures different than those shown in the drawings.

Figure 2:
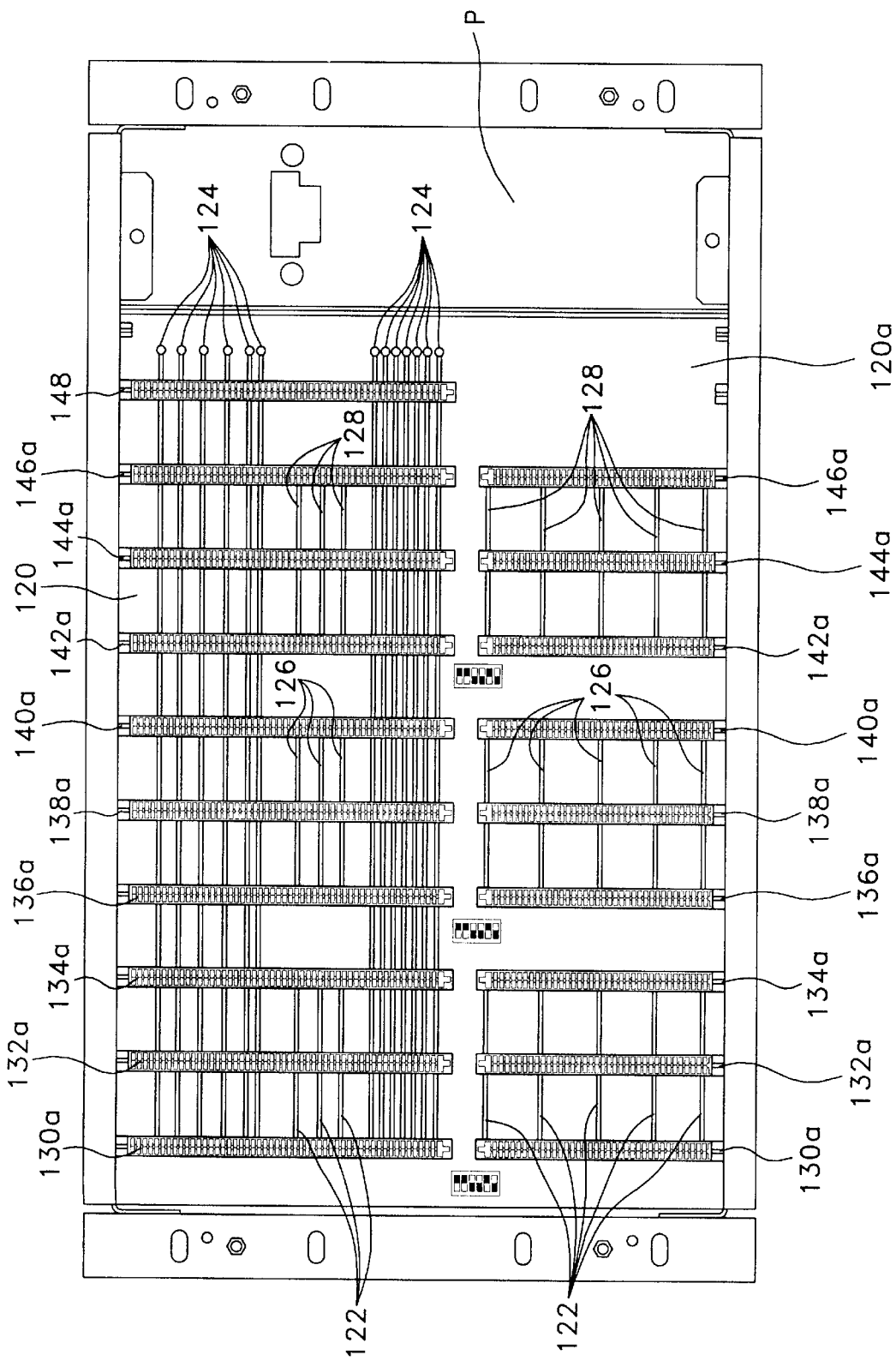
FIG. 2 is a front view of the switcher shown in FIG. 1.
Figure 3:
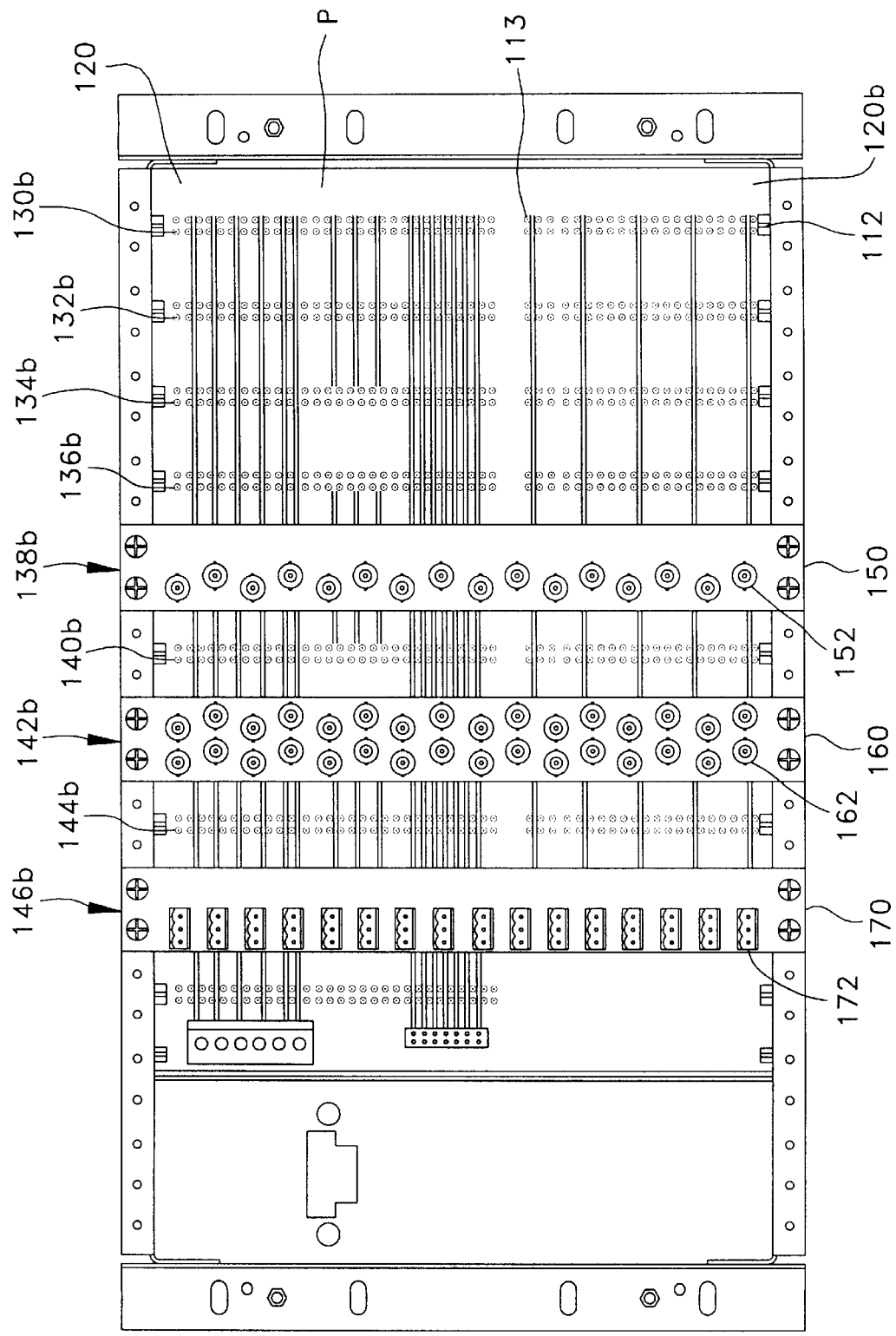
FIG. 3 is a rear view of the switcher shown in FIG. 1.

Referring now to FIGS. 1–3, there are shown isometric, front and rear views of a switcher 100 in accordance with a preferred embodiment of the present invention. Switcher 100 includes a motherboard 120, a first switch card 142 which may be controlled to selectively route ones of a first plurality of input signals to a first output card 146, and a second switch card 144 which may be controlled to selectively route ones of a second plurality of input signals to the first output card 146. The front face 120a of the motherboard 120 is shown in FIG. 2, which is a front view of switcher 100, and the rear face 120b of the motherboard 120 is shown in FIG. 3, which is a rear view of switcher 100. The front face 120a and the rear face 120b of the motherboard 120 are disposed along a motherboard plane P. The first and second switch cards 142, 144 and the first output card 146 are each coupled to the front face 120a of the motherboard perpendicular to the motherboard plane P. In a preferred embodiment, the first and second switch cards 142, 144 and the first output card 146 are detachably coupled to the front face 120a of the motherboard 120 at connection slots 142a, 144a, 146a, respectively. Guide grooves 111 function to assist in aligning the cards 142, 144, 146 with corresponding connection slots in the motherboard 120 when the cards are being coupled to the motherboard 120, and guide grooves 111 also function to hold cards 142, 144, 146 in place after the cards have been attached to the motherboard 120.

The first output card 146 includes an amplifier (not shown) for amplifying signals received from the first switch card 142 and the second switch card 144. The first output card 146 and the first and second switch cards 142, 144 are electronically coupled to each other and to the motherboard 120 by a first signal bus 128 on motherboard 120. In the embodiment shown in FIGS. 1–3, the first and second switch cards 142, 144 are adapted to each receive 16 input signals, and the first signal bus 128 therefore includes 16 signal lines. In alternate embodiments (not shown), the signal bus 128 may include less than or more than 16 signal lines, and the first and second switch cards 142, 144 may be adapted to each receive less than or more than 16 input signals. Switcher 100 further includes a controller card (not shown) for controlling the routing of the input signals to the output signal ports. The controller card preferably connects to switcher 100 at connection slot 148a in the motherboard 120. The controller card, the first and second switch cards 142, 144 and the first output card 146, are electronically coupled to each other and to the motherboard by a control bus 124 on the motherboard 120. The motherboard 120, the first and second switch cards 142, 144, the output card 146, and the control card are all disposed within a housing 110. In the preferred embodiment shown in FIG. 1, housing 110 is sized and configured such that the housing may be bolted or secured within a standard computer equipment rack.

Although the switcher shown in FIGS. 1–3 includes only two switch cards 142, 144 and one output card 146, the motherboard 120 includes additional connection slots for receiving further switch cards (that are substantially the same as switch cards 142, 144), and further output cards (that are substantially the same as output card 146). More particularly, the front face 120a of motherboard 120 includes connection slots 130a, 132a and 134a for respectively receiving a third switch card, a fourth switch card and a second output card. Like cards 142, 144 and 146, any further switch or output cards inserted in connection slots 130a, 132a and 134a will be aligned perpendicular to the motherboard plane P. When inserted into connection slot 130a, the third switch card may be controlled to selectively route ones of a third plurality of input signals to a second output card located in connection slot 134a; similarly, when inserted in connection slot 132a, the fourth switch card may be controlled to selectively route ones of a fourth plurality of input signals to a second output card located in slot 134a. Once connected to the motherboard 120, the second output card and the third and fourth switch cards will be electronically coupled to each other and to the motherboard 120 by a second signal bus 122 (different from first signal bus 128) on motherboard 120, and the second output card and the third and fourth switch cards will be electronically coupled to each other and to the motherboard by control bus 124 on the motherboard 120.

In addition, the front face 120a of motherboard 120 includes connection slots 136a, 138a and 140a for respectively receiving a fifth switch card, a sixth switch card and a third output card. Like cards 142, 144 and 146, any further switch or output cards inserted in connection slots 136a, 138a and 140a will be aligned perpendicular to the motherboard plane P. When inserted into connection slot 136a, the fifth switch card may be controlled to selectively route ones of a fifth plurality of input signals to a third output card located in connection slot 140a; and, when inserted in connection slot 138a, the sixth switch card may be controlled to selectively route ones of a sixth plurality of input signals to a third output card located in slot 140a. Once connected to the motherboard 120, the third output card and the fifth and sixth switch cards will be electronically coupled to each other and to the motherboard 120 by a third signal bus 126 (different from first and second signal buses 122, 128) on motherboard 120, and the third output card and the fifth and sixth switch cards will be electronically coupled to each other and to the motherboard by control bus 124 on the motherboard 120.

Referring now specifically to FIG. 3, there is shown the rear face 120b of the motherboard 120. Rear face 120b includes six connection slots 130b, 132b, 136b, 138b, 142b and 144b, each of which is adapted to receive a separate frame input adapter card, and rear face 120b includes three connection slots 134b, 140b and 146b, each of which is adapted to receive a separate frame output adapter card. Connection slots 130a, 132a, 134a, 136a, 138a, 140a, 142a, 144a, 146a on front face 120a are positioned opposite connection slots 130b, 132b, 134b, 136b, 138b, 140b, 142b, 144b, 146b on front face 120b, such that cards which are positioned in opposing connection slots lie within a common plane that is perpendicular to the motherboard plane P. Guide grooves 112 function to assist in aligning the frame input adapter cards and the frame output adapter cards with their corresponding connection slots in the motherboard 120 when the cards are being coupled to the rear face 120b of the motherboard 120, and guide grooves 112 also function to hold the frame input adapter cards and the frame output adapter cards in place after the cards have been attached to the rear face 120b of the motherboard 120. For purposes of illustration, frame input adapter cards 150 and 160 are shown as being connected to the motherboard at connection slots 138b, 142b, respectively, and a frame output adapter card 170 is shown as being connected to the motherboard at connection slot 146b.

Each input frame adapter card functions to receive a different plurality of input signals through a set of signal input signal ports (such as video ports 152 or video ports 162), and the input frame adapter card then provides that plurality of input signals to a switch card positioned opposite the input frame adapter card on front face 120a of the motherboard. Thus, if first, second, third, fourth, fifth and sixth input frame adapter cards were respectively positioned in connection slots 130*b*, 132*b*, 136*b*, 138*b*, 142*b* and 144*b*, the first input frame adapter card would function to receive a first plurality of input signals through a first set of signal input signal ports, and the first input frame adapter card would then provide that first plurality of input signals to a switch card positioned in connection slot 130*a* on the front face 120*a* of the motherboard; the second input frame adapter card would function to receive a second plurality of input signals through a second set of signal input signal ports, and the second input frame adapter card would then provide that second plurality of input signals to a switch card positioned in connection slot 132*a* on the front face 120*a* of the motherboard; the third input frame adapter card would function to receive a third plurality of input signals through a third set of signal input signal ports, and the third input frame adapter card would then provide that third plurality of input signals to a switch card positioned in connection slot 136*a* on the front face 120*a* of the motherboard; the fourth input frame adapter card would function to receive a fourth plurality of input signals through a fourth set of signal input signal ports, and the fourth input frame adapter card would then provide that fourth plurality of input signals to a switch card positioned in connection slot 138*a* on the front face 120*a* of the motherboard; the fifth input frame adapter card would function to receive a fifth plurality of input signals through a fifth set of signal input signal ports, and the fifth input frame adapter card would then provide that fifth plurality of input signals to a switch card positioned in connection slot 142*a* on the front face 120*a* of the motherboard; and the sixth input frame adapter card would function to receive a sixth plurality of input signals through a sixth set of signal input signal ports, and the sixth input frame adapter card would then provide that sixth plurality of input signals to a switch card positioned in connection slot 144*a* on the front face 120*a* of the motherboard.

Each output frame adapter card has a plurality of output signal ports (such as audio ports 172) for receiving amplified signals from an output card positioned opposite the output frame adapter card on front face 120*a* of the motherboard and outputting those amplified signals from the switcher 100. Thus, if first, second, and third output frame adapter cards were respectively positioned in connection slots 134*b*, 140*b* and 146*b*, the first output frame adapter card would function to output a first plurality of amplified signals received from an output card positioned in connection slot 134*a*; the second output frame adapter card would function to output a second plurality of amplified signals received from an output card positioned in connection slot 140*a*; and the third output frame adapter card would function to output a third plurality of amplified signals received from an output card positioned in connection slot 146*a*.

In the preferred embodiment of the present invention, each of the input frame adapter cards and the output frame adapter cards described above is detachably coupled to the motherboard 120. This feature allows a user to purchase and operate a switcher 100 with perhaps only one or two input frame adapter cards and only one output frame adapter card. However, the user may thereafter easily upgrade the switcher to handle more numbers of signals or different of types of signals by simply installing further or different input frame adapter cards and/or output frame adapter cards as desired. In the preferred embodiment, wire-wrap pins 113 which protrude from the rear face 120*b* of the motherboard are used to detachably couple each input frame adapter card and each output frame adapter card to the motherboard 120. The wire-wrap pins 113 are sized to slide into and detachably mate with openings 154*a*, 174*a* in connectors 154, 174 (shown in FIGS. 4–7).

Figure 4:
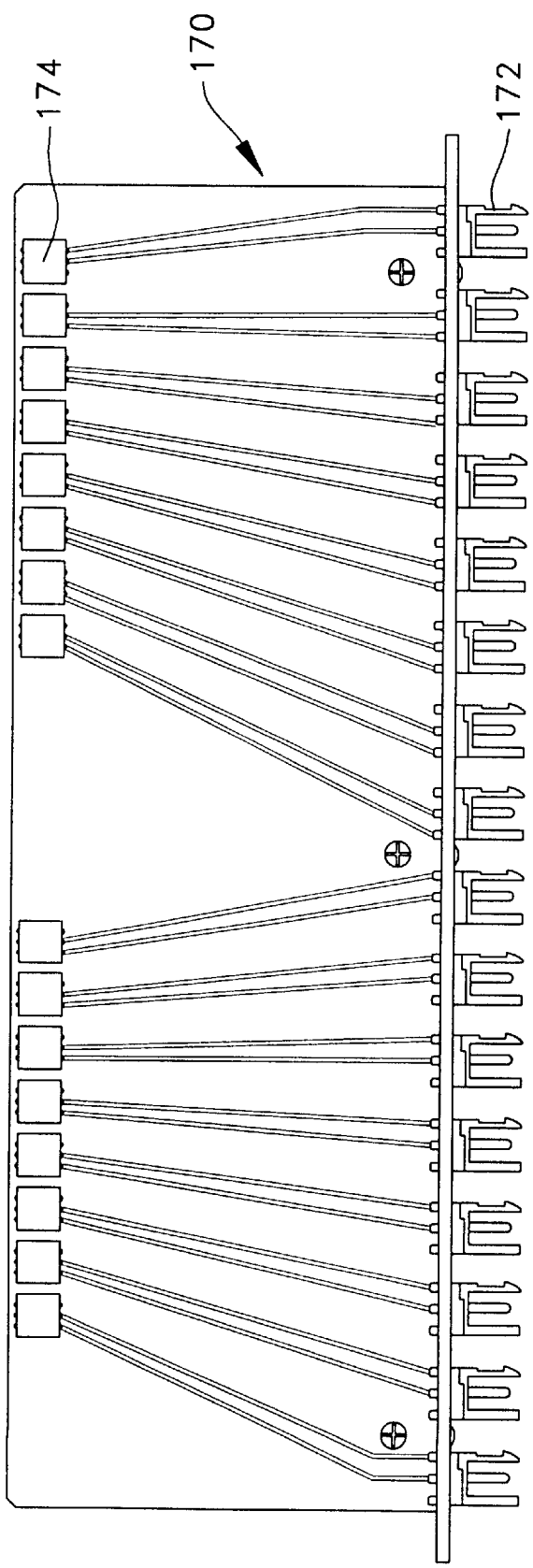
FIG. 4 is a side view of a frame adapter card for receiving or outputting audio signals, in accordance with a preferred embodiment of the present invention.
Figure 5:
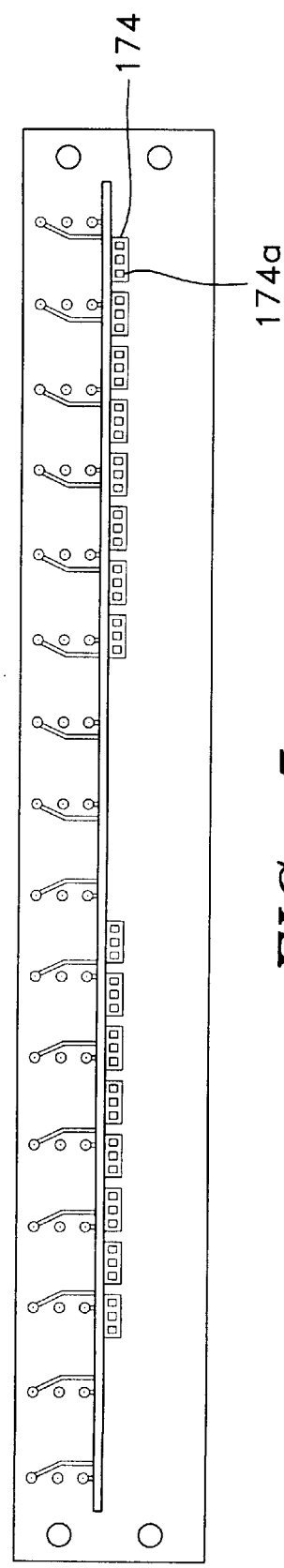
FIG. 5 is an end view of the frame adapter card shown in FIG. 4.
Figure 8:
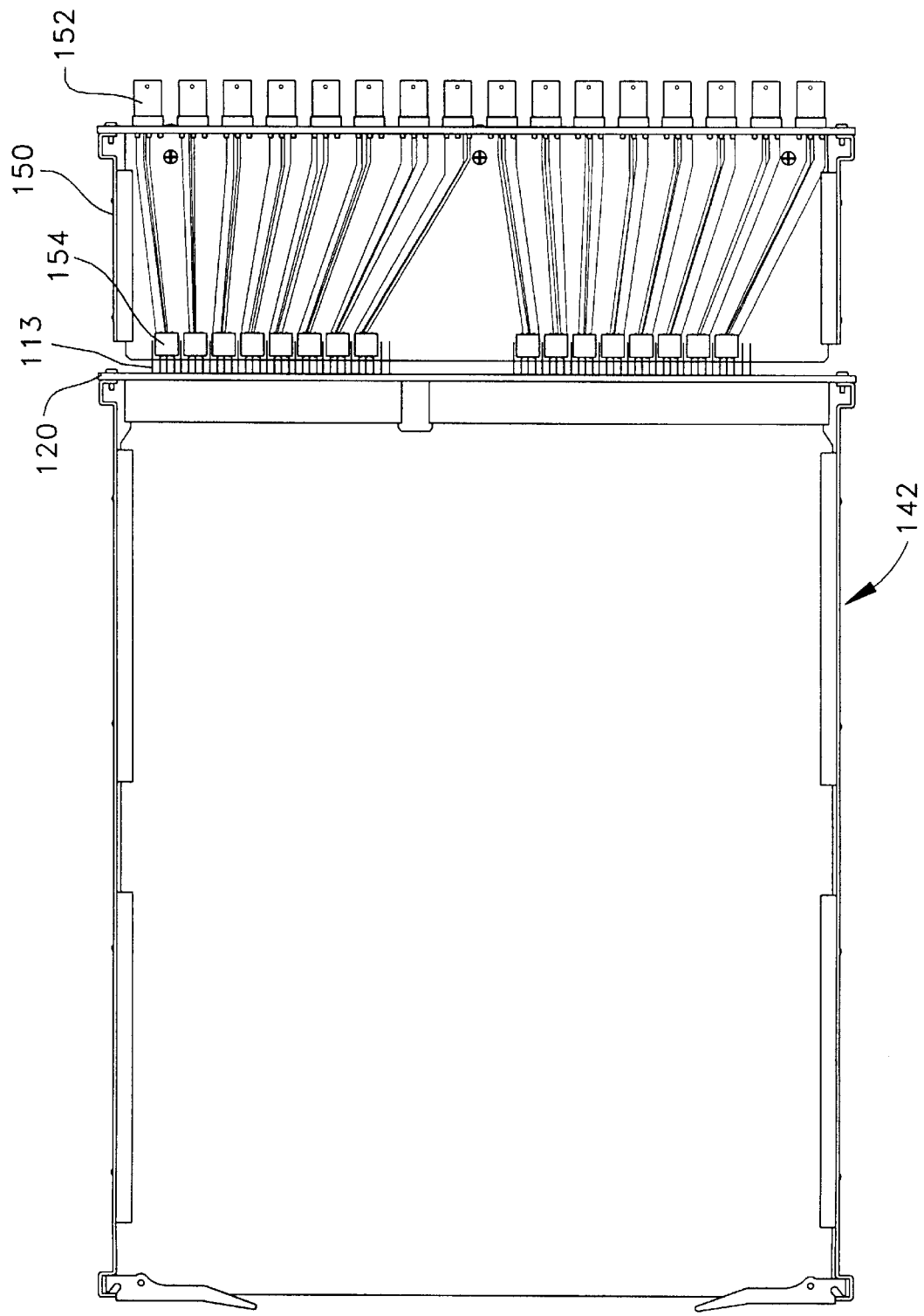
FIG. 8 shows a side view of a switch or output card coupled to a frame adapter card by a motherboard, in accordance with a preferred embodiment of the present invention.

In the preferred embodiment, the input signals received by the input frame adapter cards used in switcher 100 and the signals output by the output frame adaptor cards used in switcher 100 may be either analog video signals, analog audio signals, digital video signals, or digital audio signals. FIGS. 4–5 show an exemplary frame adapter card for receiving or outputting audio signals, in accordance with a preferred embodiment of the present invention. Similarly, FIGS. 6–7 show an exemplary frame adapter card for receiving or outputting video signals, in accordance with a preferred embodiment of the present invention. The frame adapter cards shown in FIGS. 4–7 may alternatively be employed either as input frame adaptor cards or output frame adaptor cards, depending upon the connection slot used for coupling the cards to the motherboard. More particularly, if either of the frame adaptor cards shown in FIGS. 4–7 is disposed in any of connection slots 130*b*, 132*b*, 136*b*, 138*b*, 142*b* or 144*b*, the frame adapter cards will function as input frame adaptor cards; conversely, if either of the frame adaptor cards shown in FIGS. 4–7 is disposed in any of connection slots 134*b*, 140*b* or 146*b*, the frame adapter cards will function as output frame adaptor cards.

In the preferred embodiment shown in FIGS. 1–3, all of the card connection slots 130*a*, 132*a*, 134*a*, 136*a*, 138*a*, 140*a*, 142*a*, 144*a* and 146*a* are connected on motherboard 120 by a common control bus 124. However, these card connection slots do not all share a common signal bus. More particularly, card connection slots 130*a*, 132*a*, and 134*a* are connected on motherboard 120 by a signal bus 122; card connection slots 136*a*, 138*a*, and 140*a* are connected on motherboard 120 by a signal bus 126; and card connection slots 142*a*, 144*a*, and 146*a* are connected on motherboard 120 by a signal bus 122. This arrangement allows a single controller disposed in connection slot 148*a* to simultaneously route different sets of video/audio signals along three separate signal buses.

Furthermore, it is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A switcher for selectively routing a first plurality of input signals to a first plurality of output signal ports, said switcher comprising a motherboard, a first switch card for routing ones of said first plurality of input signals to a first output card, said first output card including an amplifier for amplifying signals received from said first switch card, said first output card and said first switch card being electronically coupled to each other and to said motherboard by a first signal bus on said motherboard, said switcher further including a controller card for controlling said routing of said first plurality of input signals to said first plurality of output signal ports, said controller card, said first output card, and said first switch card being electronically coupled to each other and to said motherboard by a control bus on said motherboard, wherein said motherboard, said first switch card, said first output card and said control card are disposed within a housing;

a first input frame adapter card for receiving said first plurality of input signals and providing said first plurality of input signals to said first switch card and said motherboard, said first input frame adapter card being detachably coupled to said housing and to said first signal bus on said motherboard; and a first output frame adapter card having said first plurality of output signal ports for receiving amplified signals from said first output card and outputting said amplified signals from said switcher, said first output frame adapter card being detachably coupled to said housing and to said first signal bus on said motherboard.

2. The switcher of claim 1, said motherboard being disposed along a motherboard plane in said housing, said motherboard having a front face and a rear face opposite said front face, wherein said first input frame adapter card is detachably coupled to said rear face of said motherboard perpendicular to said motherboard plane, and said first output frame adapter card is detachably coupled to said rear face of said motherboard perpendicular to said motherboard plane.

3. The switcher of claim 2, wherein said first switch card is coupled to said front face of said motherboard perpendicular to said motherboard plane, and said first output card is coupled to said front face of said motherboard perpendicular to said motherboard plane.

4. The switcher of claim 3, further comprising a second switch card for routing ones of a second plurality of input signals to said first output card, said second switch card being coupled to said front face of said motherboard perpendicular to said motherboard plane, wherein said second switch card is electronically coupled to said first output card and said motherboard by said first signal bus on said motherboard, and said second switch card is electronically coupled to said motherboard by said control bus on said motherboard.

5. The switcher of claim 4, further comprising a second input frame adapter card for receiving said second plurality of input signals and providing said second plurality of input signals to said second switch card and said motherboard, said second input frame adapter card being detachably coupled to said rear face of said motherboard perpendicular to said motherboard plane and to said first signal bus on said motherboard.

6. The switcher of claim 5, wherein said input signals received by said input frame adapter cards are selected from the group consisting of analog video signals, analog audio signals, digital video signals, and digital audio signals.

7. The switcher of claim 6, wherein said first plurality of output ports on said first output frame adapter card are selected from the group consisting of video output ports and audio output ports.

8. The switcher of claim 7, wherein said first input frame adapter card, said second input frame adapter card and said first output frame adapter card are each detachably coupled to said motherboard with wire-wrap pins that are affixed to said motherboard perpendicular to said motherboard plane.

9. The switcher of claim 8, wherein said first switch card and said first input frame adapter card are disposed in a first plane, said second switch card and said second input frame adapter card are disposed in a second plane different from said first plane, and said first output card and said first output frame adapter card are disposed in a third plane different from said first and second planes, wherein said first, second and third planes are aligned in parallel, and said first, second and third planes are aligned perpendicular to said motherboard plane.

10. The switcher of claim 9, further comprising a third switch card for routing ones of a third plurality of input signals to a second output card, said second output card including an amplifier for amplifying signals received from said third switch card, said second output card and said third switch card being electronically coupled to each other and to said motherboard by a second signal bus different from said first signal bus on said motherboard, said third switch card and said second output card being electronically coupled to said control bus on said motherboard, a third input frame adapter card for receiving said third plurality of input signals and providing said third plurality of input signals to said third switch card and said motherboard, said third input frame adapter card being detachably coupled to said housing and to said second signal bus on said motherboard, and a second output frame adapter card having a second plurality of output ports for receiving amplified signals from said second output card and outputting said amplified signals from said switcher, said second output frame adapter card being detachably coupled to said housing and to said second signal bus on said motherboard.

11. The switcher of claim 10, wherein said third input frame adapter card is detachably coupled to said rear face of said motherboard perpendicular to said motherboard plane, and said second output frame adapter card is detachably coupled to said rear face of said motherboard perpendicular to said motherboard plane.

12. The switcher of claim 11, wherein said third switch card is coupled to said front face of said motherboard perpendicular to said motherboard plane, and said second output card is coupled to said front face of said motherboard perpendicular to said motherboard plane.

13. The switcher of claim 12, further comprising a fourth switch card for routing ones of a fourth plurality of input signals to said second output card, said fourth switch card being coupled to said front face of said motherboard perpendicular to said motherboard plane, wherein said fourth switch card is electronically coupled to said second output card and said motherboard by said second signal bus on said motherboard, and said fourth switch card is electronically coupled to said motherboard by said control bus on said motherboard.

14. The switcher of claim 13, further comprising a fourth input frame adapter card for receiving said fourth plurality of input signals and providing said fourth plurality of input signals to said fourth switch card and said motherboard, said fourth input frame adapter card being detachably coupled to said rear face of said motherboard perpendicular to said motherboard plane and to said second signal bus on said motherboard.

15. The switcher of claim 14, wherein said third input frame adapter card, said fourth input frame adapter card and said second output frame adapter card are each detachably coupled to said motherboard with wire-wrap pins that are affixed to said motherboard perpendicular to said motherboard plane.

16. The switcher of claim 15, further comprising a fifth switch card for routing ones of a fifth plurality of input signals to a third output card, said third output card including an amplifier for amplifying signals received from said fifth switch card, said third output card and said fifth switch card being electronically coupled to each other and to said motherboard by a third signal bus different from said first signal bus and said second signal bus on said motherboard, said fifth switch card and said third output card being electronically coupled to said control bus on said motherboard, a fifth input frame adapter card for receiving said fifth plurality of input signals and providing said fifth plurality of input signals to said fifth switch card and said motherboard, said fifth input frame adapter card being detachably coupled to said housing and to said third signal bus on said motherboard, and a third output frame adapter card having a third plurality of output ports for receiving amplified signals from said third output card and outputting said amplified signals from said switcher, said third output frame adapter card being detachably coupled to said housing and to said third signal bus on said motherboard.

17. The switcher of claim 16, wherein said fifth input frame adapter card is detachably coupled to said rear face of said motherboard perpendicular to said motherboard plane, and said third output frame adapter card is detachably coupled to said rear face of said motherboard perpendicular to said motherboard plane.

18. The switcher of claim 17, wherein said fifth switch card is coupled to said front face of said motherboard perpendicular to said motherboard plane, and said third output card is coupled to said front face of said motherboard perpendicular to said motherboard plane.

19. The switcher of claim 18, further comprising a sixth switch card for routing ones of a sixth plurality of input signals to said third output card, said sixth switch card being coupled to said front face of said motherboard perpendicular to said motherboard plane, wherein said sixth switch card is electronically coupled to said third output card and said motherboard by said third signal bus on said motherboard, and said sixth switch card is electronically coupled to said motherboard by said control bus on said motherboard.

20. The switcher of claim 19, further comprising a sixth input frame adapter card for receiving said sixth plurality of input signals and providing said sixth plurality of input signals to said sixth switch card and said motherboard, said sixth input frame adapter card being detachably coupled to said rear face of said motherboard perpendicular to said motherboard plane and to said third signal bus on said motherboard.

21. The switcher of claim 20, wherein said fifth input frame adapter card, said sixth input frame adapter card and said third output frame adapter card are each detachably coupled to said motherboard with wire-wrap pins that are affixed to said motherboard perpendicular to said motherboard plane.

* * * * *